United States Patent [19]
Osann, Jr.

[11] Patent Number: 5,506,850
[45] Date of Patent: Apr. 9, 1996

[54] LOGIC ANALYZER FOR HIGH CHANNEL COUNT APPLICATIONS

[76] Inventor: Robert Osann, Jr., 4620 Corrida Cir., San Jose, Calif. 95129

[21] Appl. No.: 337,132

[22] Filed: Nov. 10, 1994

Related U.S. Application Data

[63] Continuation of Ser. No. 682,147, Apr. 8, 1991, abandoned.

[51] Int. Cl.⁶ .................................................. H04B 17/00
[52] U.S. Cl. ............................................ 371/22.1; 324/73.1
[58] Field of Search ................................. 371/22.1, 15.1; 324/73.1

[56] References Cited

U.S. PATENT DOCUMENTS

| | | | |
|---|---|---|---|
| 3,922,537 | 11/1975 | Jackson | 371/15.1 |
| 3,976,940 | 8/1976 | Chau | 371/22.1 |
| 4,425,643 | 1/1984 | Chapman | 371/22.1 |
| 4,434,488 | 2/1984 | Palmquist | 371/22.1 |
| 4,475,237 | 10/1984 | Glasby | 371/22.1 X |
| 4,517,512 | 5/1985 | Petrich | 371/22.1 |
| 4,573,152 | 2/1986 | Greene | 371/15.1 |
| 4,654,848 | 3/1987 | Noguchi | 371/22.1 |
| 4,788,492 | 11/1988 | Schubert | 324/73 R |
| 4,989,209 | 1/1991 | Littleburg | 371/22.1 |
| 5,067,130 | 11/1991 | Jackson | 371/15.1 X |

FOREIGN PATENT DOCUMENTS 2100011 12/1982 United Kingdom .................. 371/22.1

Primary Examiner—Robert W. Beausoliel, Jr.
Assistant Examiner—Glenn Snyder
Attorney, Agent, or Firm—Fliesler, Dubb, Meyer & Lovejoy

[57] ABSTRACT

The invention provides a multi-stage architecture where the first stage is extremely wide and fast, but has a shallow depth which greatly reduces cost. A second stage provides a more conventional variable width/depth memory. Between the two stages is a programmable cross point switch matrix which determines which channels, of the many channels from the first stage, is to be connected as inputs to the second stage. Trigger comparisons may be performed in either or both stages.

2 Claims, 6 Drawing Sheets

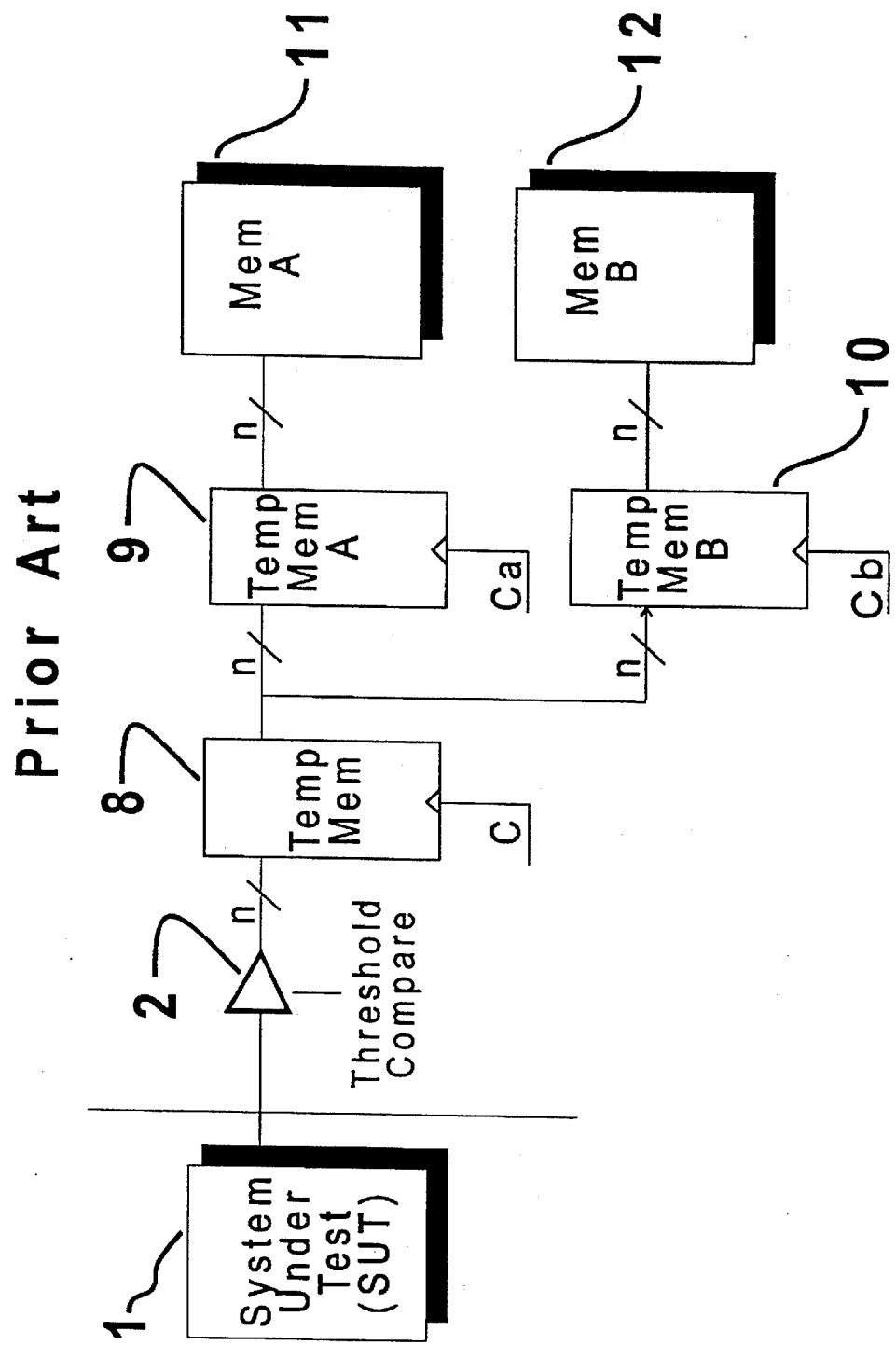

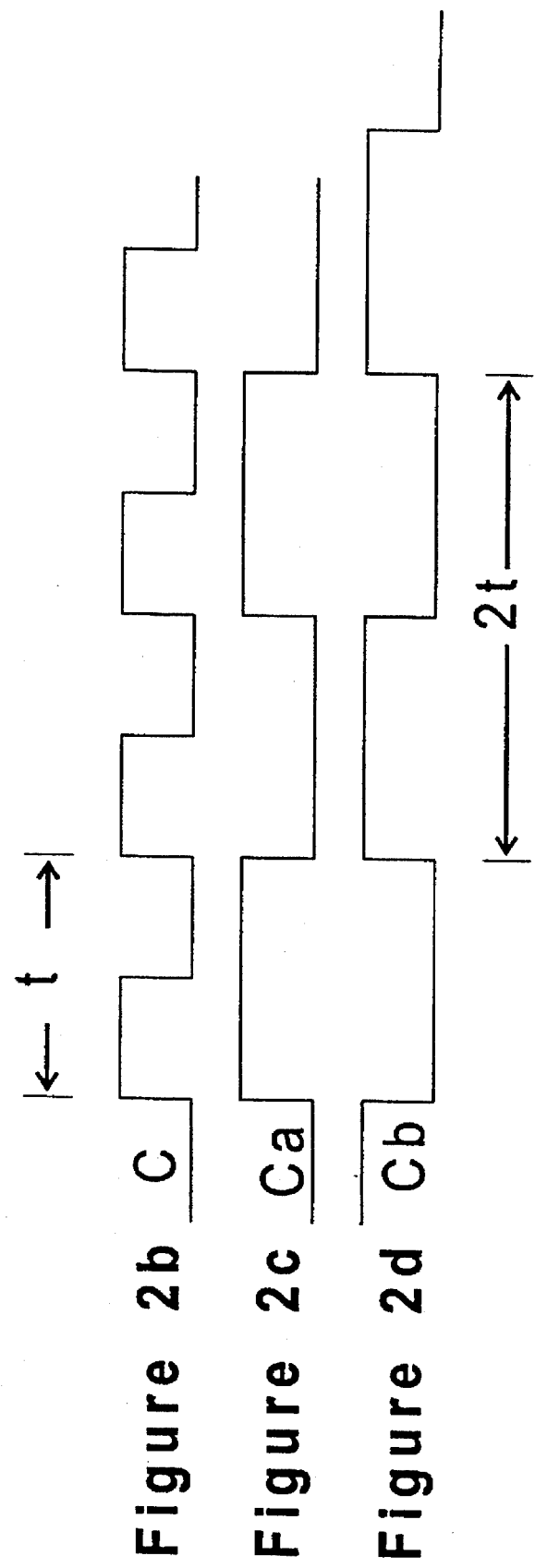

LOGIC ANALYZER FOR HIGH CHANNEL COUNT APPLICATIONS

This application is a Continuation of Ser. No. 07/682,147, filed Apr. 8, 1991, now abandoned.

CROSS-REFERENCE TO RELATED DISCLOSURE

This application relates to the following disclosures which were previously filed under the Disclosure Document Program:

1) Ser. No. 224271 entitled "Multi-stage Acquisition Architecture for Digital Data Acquisition Systems" by Robert Osann, Jr. filed Apr. 10, 1989.

1. Field of the Invention

This invention relates to logic analyzers used in the debug of digital system prototypes, and in particular to logic analyzers with special consideration for applications where a very large number of signals from the System Under Test (SUT) must be captured and analyzed.

2. Background of the Invention

In principle, the basic operation and structure of most logic analyzers is quite similar. As shown in FIG. 1, data from the SUT 1 is first converted to a digital level (through some form of threshold comparator 2) and is then stored in a temporary storage/memory element 3 which usually consists of flip-flops or data latches. The purpose of this temporary storage is to hold a stable value of a data sample for a complete period of the clock so that this data sample may be properly written into the main data memory 4. The use of such a temporary memory or storage element may be seen in U.S. Pat. No. 4,654,848 to Noguchi, U.S. Pat. No. 4,697,138 to Morishita, and U.S. Pat. No. 4,788,492 to Schubert. Data is written into the main memory under the control of circuit 5 which observes trigger/comparator 6 and also controls the selection of either an internally generated or external sample clock by selector 7.

From this basic form, logic analyzer architectures have evolved over the years in response to the changing needs of system designers. In general, this evolution has occurred in response to two primary needs: the increased use and complexity of microprocessors and higher system speeds. While microprocessor debug required somewhat higher channel width (more signal input lines), the need to capture signals at higher clock rates moved architectures in the opposite direction. For higher speed operation, a narrower channel width could support these higher clock rates without faster memories by implememting the architecture of FIG. 2.

Analyzer architectures such as that shown in FIG. 2a achieved higher clock rates by using twice the width of memory and alternating which memory a data sample was written to. Here, data from the SUT via the analyzer's threshold comparison circuit is input to a first temporary storage element 8. At a later time, this data sample is transferred to one of the multiple secondary temporary storage elements 9 and 10. These are clocked with waveforms Ca of FIG. 2c and Cb of FIG. 2d which are synchronized with primary clock waveform C of FIG. 2b. Waveforms Ca and Cb are one half the frequency of waveform C. From temporary storage elements 9 and 10, data is written to memories 11 and 12 respectively during the periods between the clock edges of Ca and Cb.

Thus, data samples from the SUT can be acquired at twice the rate they can be stored in each main memory. The cost is that twice as many main memory devces must be used (at twice the expense). Notice that this same interleaved memory scheme may be extended to allow 4 times the speed by using 4 times as many memories, and 8 times the speed by using 8 times the memories, and so on.

As mentioned earlier, miocroprocessor applications have different needs when it comes to logic analysis tools. A larger number of channels is needed for microprocessor analysis, and data acquisition speeds are much lower than those of logic debug so, for microprocessors, the interleaved memory scheme described in the previous paragraphs is not necessary. Since those who purchase logic analyzers commonly have need of both capabilities, many of today's popular analyzers incorporate the capability to function as both a standard architecture (one bit of main memory per input channel) and the interleaved architecture described above. This flexible architecture with its variable width and depth has, until now, been an excellent compromise, making the most of memory speeds given the high cost of fast memory.

Recently, however, the needs of system development have changed. Electronic systems have gotten significantly more dense and complex due to the increased use of ASICs (application specific integrated circuits) and high pin-count surface mount packages. Simulation is being used to debug logic designs even before a hardware prototype is ever built, but invariably, some problems remain and must be found by debugging the prototype using a logic analyzer.

The needs and expectations of designers have changed, however, and prior art logic analyzers cannot deliver the combination of high speed and high channel count required to effectively debug today's complex logic systems. Simulation has taught designers the value of being able to easily observe any node in a circuit design as that circuit is functionally exercised. A logic analyzer which can support such a high degree of observability for the actual prototype must have a channel count which is significantly higher than any of today's offerings. At the same time, it must have the high speed to support today's ever increasing system performance levels. This could be accomplished in a "brute force" manner by using an interleaved architecture with a very large number of expensive fast memories, or alternately, a new and different architecture is needed which provides both high speed and channel count at a reasonable cost.

SUMMARY OF THE INVENTION

In accordance with the present invention, the drawbacks of prior art logic analyzers are overcome by providing a multi-stage architecture where the first stage is extremely wide and fast, but has a shallow depth which greatly reduces cost. A second stage provides a more conventional variable width/depth memory. Between the two stages is a programmable cross point switch matrix which determines which, of the many channels from the first stage, is to be connected as inputs to the second stage. Trigger comparisons may be performad in either or both stages.

The great width of the first stage allows the user to observe most or all of the signals in a prototype circuit and, even though not much storage depth is available, the majority of problems can still be found. When more storage depth is needed to solve a particular problem, the appropriate signals from the first stage are steered to the second stage via the cross point switch circuit. Both the first and second stages may have trigger/comparison capability. Optionally, pipelined data storage may be inserted between stages or-within stages to allow partial comparisons to be performed over multiple clock stages.

Physically, both stages may reside in the same enclosure or may be separated to allow the first stage to be placed closer to the SUT. To allow the first stage to acquire data in very close physical proximity to the SUT, the first stage may even be broken into several portions and distributed among multiple points of attachment to the SUT. Alternately, both the first stage and the cross point switch may be broken into portions which are distributed among multiple points of attachment to the SUT.

BRIEF DESCRIPTION OF THE DRAWINGS

FIG. 2a shows the basic elements of prior art logic analyzers which use interleaved memory in multiple blocks to allow data acquisition at higher speeds without requiring faster memories.

FIGS. 2b, 2c and 2d show the interleaved waveforms used with the architecture of FIG. 2a for clocking the temporary storage elements.

DETAILED DESCRIPTION

In most logic analyzers which are used in the analysis and debug of electronic systems and circuits, the acquisition circuitry is typically located entirely in the main system enclosure. By primary acquisition circuitry, what is meant is that circuitry which, upon the edge of either an externally or internally generated clock, will sample and store the state of various signals coming from the system under test (SUT). The number of acquisition channels (signals from the system under test which can be observed at any one time) is typically limited in conventional systems due to the cost associated with this circuitry, the main component of which is the fast static RAM memory typically required.

Figure 1:
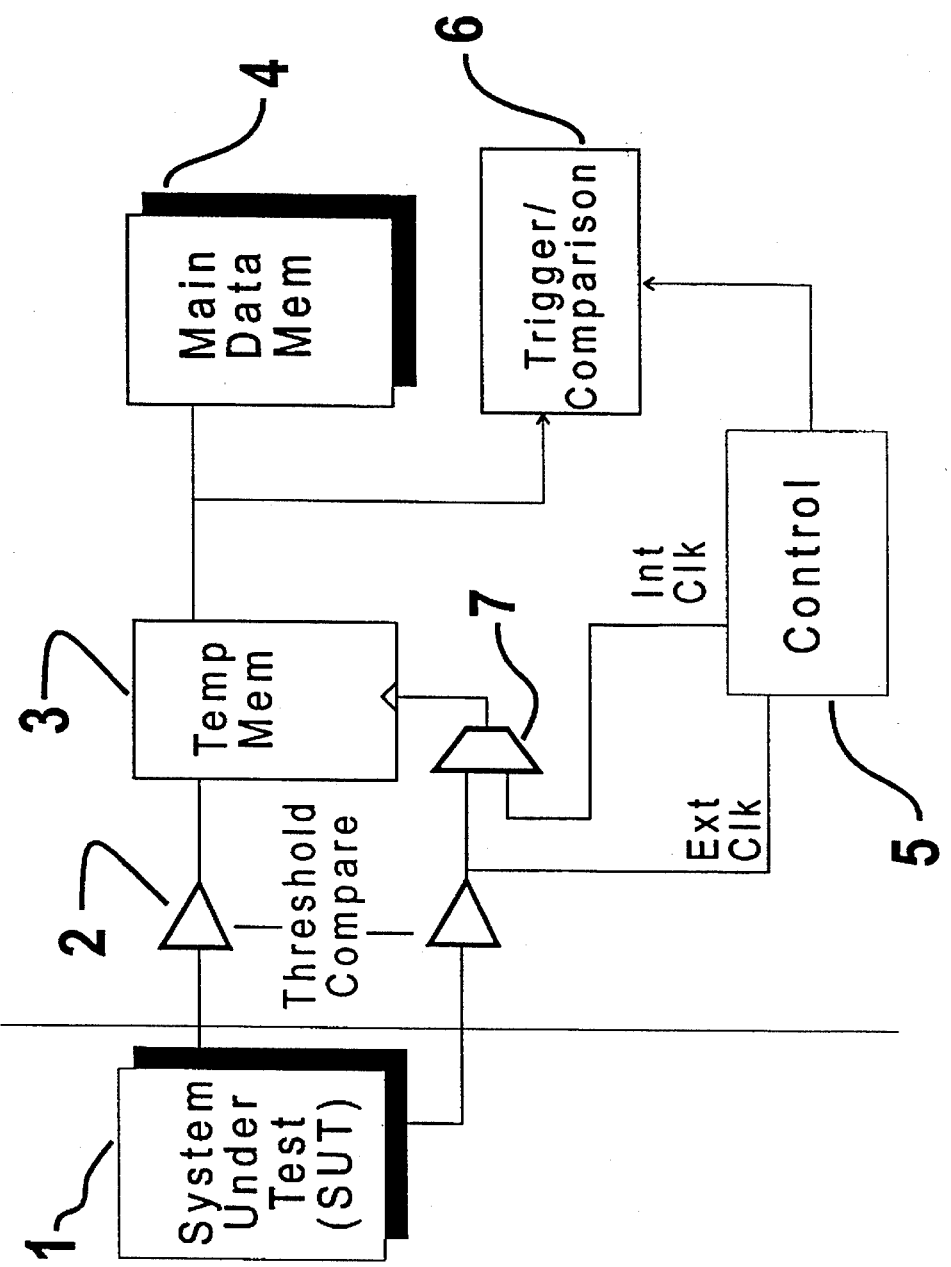
FIG. 1 shows a simple view of the basic architecture of most prior art logic analyzers.
Figure 3:
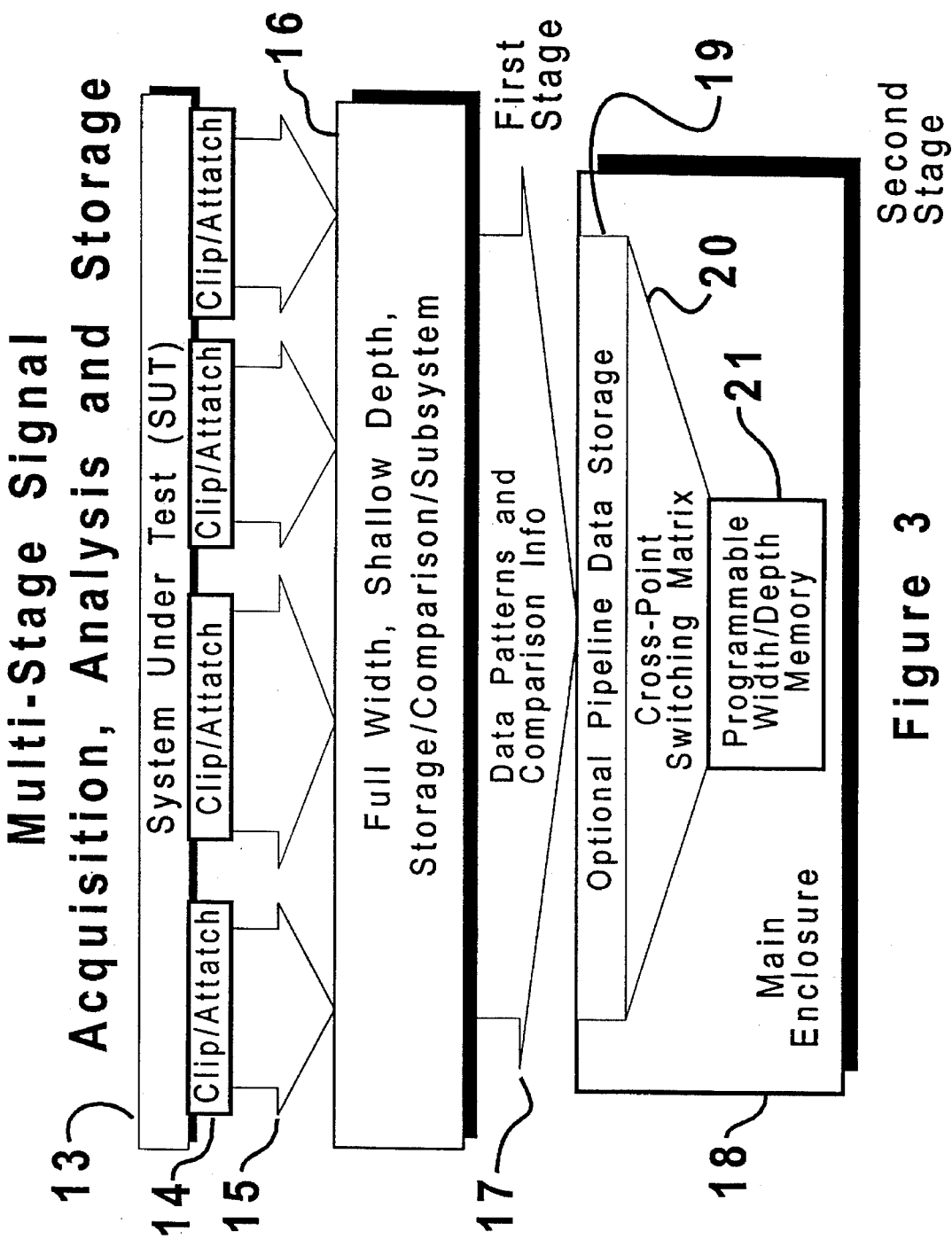
FIG. 3 shows one embodiment of the present invention where the first stage subsystem is contained as a single unit.

An alternative to conventional architectures is shown in FIG. 3 where the acquisition circuitry is split into two stages. The first stage 16 receives data directly from the system under test (SUT) 13 via conductors 15 which are connected to the SUT via attachment means 14 which might be a multi-pin clip. These attatchment means would connect to all pins of each device in the system under test which the user wishes to observe, and the signals from all of these pins would be transmitted via conductors 15 to the first stage 16.

The first stage contains the necessary circuitry to receive, process, store, and transmit all signals being passed from the SUT 13 via 14 and 15. In processing this data, the first stage circuitry first compares each incoming signal level with a voltage threshold to determine its value. This signal value information is then registered and compared with any trigger information. The results of this comparison are sent to the main system where further comparisons may be done if necessary.

All signal information which is registered in the first stage system is stored in a local memory contained in that system. This memory need only be shallow in depth, and is probably implemented entirely in ASIC devices which also contain other major components of the first stage system. This shallow memory might be implemented with some form of shift register which could be constructed of flip-flops or half-latches (transparent latches) allowing a much higher acquisition speed than any commodity static RAM would allow. In total, this architecture allows all pins in the SUT which have been attatched to, to have their values both monitered and stored, even though the shallow memory depth does not necessarily allow storage of many data samples.

When greater numbers of samples than the first stage can store are needed, the storage in the second stage 18 comes into play. All data registered in the first stage system is passed on to the main system (second stage) where it is optionally stored again (in a pipeline storage subsystem 19) on entry, along with comparison information. Subsequently, the data entering the main system enters a crosspoint switch or multiplexer matrix 20 where a portion of the data channels are selected and steered to a memory 21 which may have a variable width/depth capability.

Figure 4:
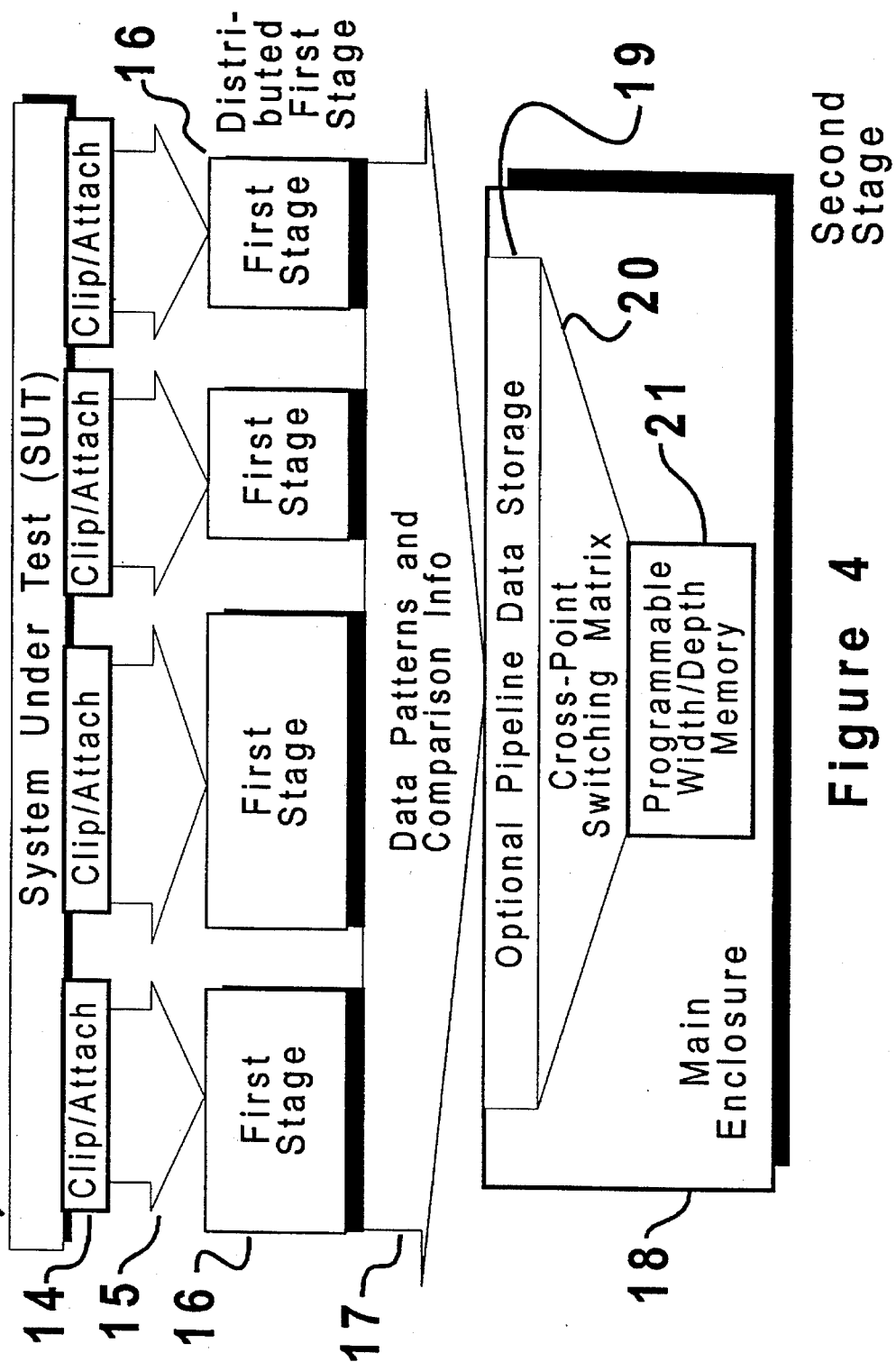
FIG. 4 shows a second embodiment of the present invention where the first stage subsystem has been segmented into different portions which are distributed among the various points of attachment to the SUT.

A further evolution of the multi-stage architecture is shown in FIG. 4, where the first stage subsystem has been segmented into multiple portions 16. By breaking the first stage into smaller portions, each portion may be physically located closer to the point where its conductors are attached to the SUT. Here, the results of comparisons in the various first stage subsystems are sent along with stored data 17 to the second stage 18 where they are combined with comparison data from other first stage systems, the combined results being returned to all first stage systems.

Figure 5:
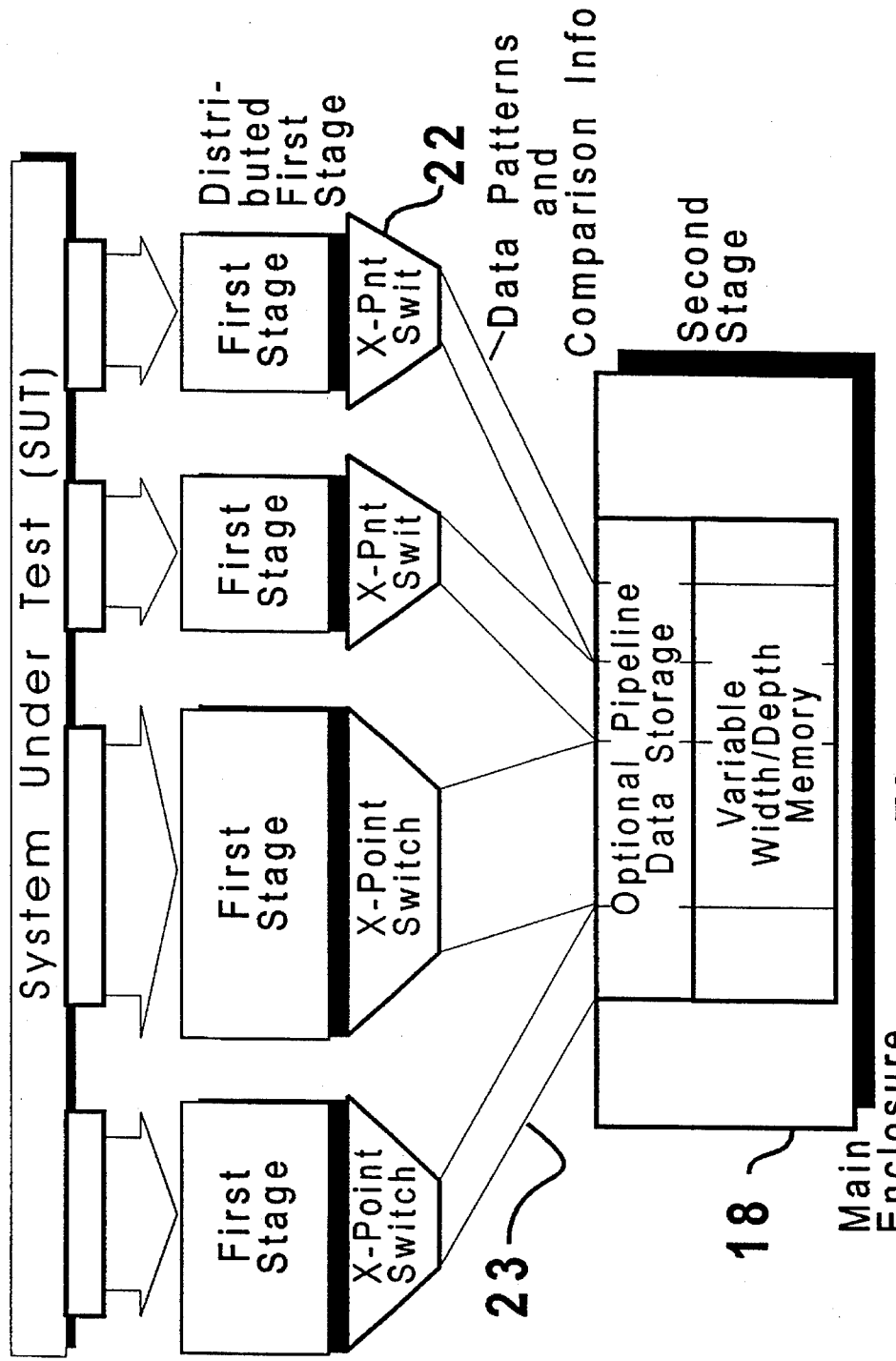
FIG. 5 shows a third embodiment of the present invention where the both the first stage subsystem and cross point switch matrix have been segmented into different portions which are distributed among the various points of attachment to the SUT.

The preferred embodiment of the present invention is shown in FIG. 5 where both the first stage subsystem and the cross point switch matrix have been segmented into multiple portions 22. The outputs of the various cross point switches comprise stored signal data which is sent, along with comparison information via conductors 23 to the second stage system in the main enclosure. This embodiment has the benefits of the architecture shown in FIG. 4 with the additional benefit that a smaller number of conductors is needed between the various first stage subsystems (located in close proximity to the SUT) and the second stage subsystem, located in the main enclosure.

Thus, the embodiments of a multi-stage logic analyzer have been described which allow for a very high number of channels of signal capture and analysis while maintaining a relatively low system cost and complexity.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A logic analyzer architecture, comprising:

a) a first stage including first main storage means, having a first number of data acquisition and analysis channels, for storing data;

b) a second stage including second main storage means, having a second number of data acquisition and analysis channels, for storing data;

c) selection means for connecting said first stage to said second stage; and d) wherein (i) said first number of data acquisition and analysis channels is substantially larger than said second number of data acquisition and analysis channels, (ii) said first main storage means has substantially less storage depth than said second main storage means, (iii) said selection means may input a portion of said first data acquisition and analysis channels to said second stage, (iv) said first stage performs first data and trigger comparisons and sends the results of said first comparisons to said second stage, and (v) said second stage may perform second data and trigger comparisons, using the results of said first comparisons, the results of said second comparisons being sent back to said first stage.

2. A logic analyzer architecture, comprising:

a) a first stage including first main storage means, having a first number of data acquisition and analysis channels, for storing data;

b) a second stage including second main storage means, having a second number of data acquisition and analysis channels, for storing data;

c) selection means for connecting said first stage to said second stage; and d) wherein (i) said first number of data acquisition and analysis channels is substantially larger than said second number of data acquisition and analysis channels, (ii) said first main storage means has substantially less storage depth than said second main storage means, (iii) said selection means may input a portion of said first data acquisition and analysis channels to said second stage, (iv) said first stage performs first data and trigger comparisons and sends the results of said first comparisons to said second stage, (v) said second stage performs second data and trigger comparisons using the results of said first comparisons, and (vi) said first and second data and trigger comparisons are performed in a pipelined manner where partial comparisons are performed on successive edges of a sample clock.

* * * * *